US007057672B2

(12) United States Patent
Sandhu et al.

(10) Patent No.: US 7,057,672 B2
(45) Date of Patent: Jun. 6, 2006

(54) METHOD AND APPARATUS FOR HIGH FREQUENCY DATA TRANSMISSION AND TESTABILITY IN A LOW VOLTAGE, DIFFERENTIAL SWING DESIGN

(75) Inventors: Bal S. Sandhu, Fremont, CA (US); Yanmei Tian, Sunnyvale, CA (US); Chih-Chang Lin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 845 days.

(21) Appl. No.: 09/823,078

(22) Filed: Mar. 29, 2001

(65) Prior Publication Data

US 2002/0140692 A1 Oct. 3, 2002

(51) Int. Cl.
*H04N 5/38* (2006.01)
*H03F 3/45* (2006.01)

(52) U.S. Cl. ........................ 348/723; 326/83; 375/257; 330/252; 330/253

(58) Field of Classification Search ................ 348/723; 375/295, 226, 259, 260, 264, 286, 288, 257, 375/219, 220, 316; 327/208, 209, 210, 211, 327/213, 108; 330/252, 297; 333/12, 27, 333/4; 370/375; 326/86, 30, 8

See application file for complete search history.

(56) References Cited

U.S. PATENT DOCUMENTS

| | | | | | |
|---|---|---|---|---|---|
| 3,803,354 | A | * | 4/1974 | Bennett | 375/272 |
| 3,869,669 | A | * | 3/1975 | Eldert et al. | 375/272 |
| 3,943,454 | A | * | 3/1976 | Getgen | 327/361 |
| 4,527,075 | A | * | 7/1985 | Zbinden | 327/175 |
| 4,630,284 | A | * | 12/1986 | Cooperman | 375/257 |
| 6,037,824 | A | * | 3/2000 | Takahashi | 327/337 |
| 6,483,766 | B1 | * | 11/2002 | Lee | 365/230.06 |
| 6,492,855 | B1 | * | 12/2002 | Pasqualini | 327/211 |

* cited by examiner

*Primary Examiner*—Michael H. Lee
(74) *Attorney, Agent, or Firm*—Cindy T. Faatz

(57) ABSTRACT

A high frequency data transmission circuit including design for testability (DFT) features. An integrated circuit includes core control logic to provide a data signal and output drive logic including a local data latch and a transmitter. The data latch receives the data signal and provides true and complementary forms of the data signal to the transmitter over symmetrical signal paths. The transmitter provides an output signal to an external receiver.

15 Claims, 5 Drawing Sheets

METHOD AND APPARATUS FOR HIGH FREQUENCY DATA TRANSMISSION AND TESTABILITY IN A LOW VOLTAGE, DIFFERENTIAL SWING DESIGN

BACKGROUND

1. Field

An embodiment of the present invention relates to the field of data transmission and, more particularly, to transmitting data in high frequency integrated circuits.

2. Discussion of Related Art

Computer systems continue to include additional capabilities while being capable of operating at higher and higher frequencies. As operating frequencies increase, integrated circuit design becomes increasingly difficult.

As a specific example, a prior video controller integrated circuit 100 is shown in FIG. 1. The video controller 100 includes a video control core 105 that generates video data signals in response to instructions executed by a microprocessor (not shown). Video output data is to be provided to an external receiver 110 by a transmitter 115. For a typical design, the video control core is located near the center of the host integrated circuit while the transmitter is located near the periphery of the chip.

For very high operating frequencies, the signal path between the video control core 105 and the transmitter 115 can be problematic. The transmitter 115 receives both true and complementary forms of the input data from the video control core. True data (DATA IN) is provided to the transmitter 115 over the signal path including data buffers 120 and 121 while complementary data is provided to the transmitter 115 over the signal path including data buffers 123, 124 and 125. Because the signal paths for the true and complementary data paths are asymmetrical (i.e. the delay for the complementary path is longer than the delay for the true path), true and complementary data arrive at the transmitter 115 at different times, potentially incurring a "noise glitch" or asymmetrical delay to provide a valid output signal. The effect of asymmetrical delay through the transmitter or asymmetrical switching of the transmitter is similar to noise injected into the transmitter. The delay between the true and complementary paths can be equalized for a particular process corner by carefully sizing the data buffers 120, 121, 123, 124 and 125, but the delays through the paths will then vary for different processes and/or different operating parameters.

The video controller 100 also includes design for testability (DFT) logic to facilitate testing of the video controller. For the video controller 100, an internal DFT receiver 130 receives the output signal(s) from the transmitter 115 and provides an amplified output signal to combinatorial logic 135. The combinatorial logic 135 converts the amplified output signal to a digital signal that is latched by a flip-flop 140 or other latch in the video control core 105. The latched signal is then compared to an expected value to determine whether the transmitter 115 and/or other logic is operating properly.

Again, at very high operating frequencies, the DFT signal path of the video controller 100 may present issues in latching the correct data. For example, at an operating frequency of 800 MHz, data needs to be sent from the core logic 105, through the transmitter 115 and the internal DFT receiver and back to the flip-flop 140 in the video control core 105 all within one clock cycle or 1.2 ns. With long signal paths and associated noise, meeting this timing requirement may not be straightforward.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for high frequency data transmission in a low voltage, differential swing design are described. In the following description, particular types of integrated circuits and circuit configurations are described for purposes of illustration. It will be appreciated, however, that other embodiments are applicable to other types of integrated circuits, and to circuits configured in another manner.

For one embodiment, an apparatus comprises core control logic to provide a data signal, and output drive logic including a local data latch and a transmitter. The data latch receives the data signal and provides true and complementary forms of the data signal to the transmitter over symmetrical signal paths. The transmitter provides an output signal to an external receiver.

For another embodiment, a sense amplifier includes a sensing circuit having differential input bit lines. The sensing circuit senses a low voltage swing signal in response to an enable signal. The sense amplifier also includes a precharge circuit to precharge the input bit lines, and a high voltage conversion circuit to receive an input signal at a first voltage level and provide the enable signal at a higher voltage level. At least a first transistor having a gate oxide of a first thickness and a second transistor having a gate oxide of a second thickness greater than the first thickness are also included in the sense amplifier.

Additional details of these and other embodiments are provided in the description that follows.

Figure 1:
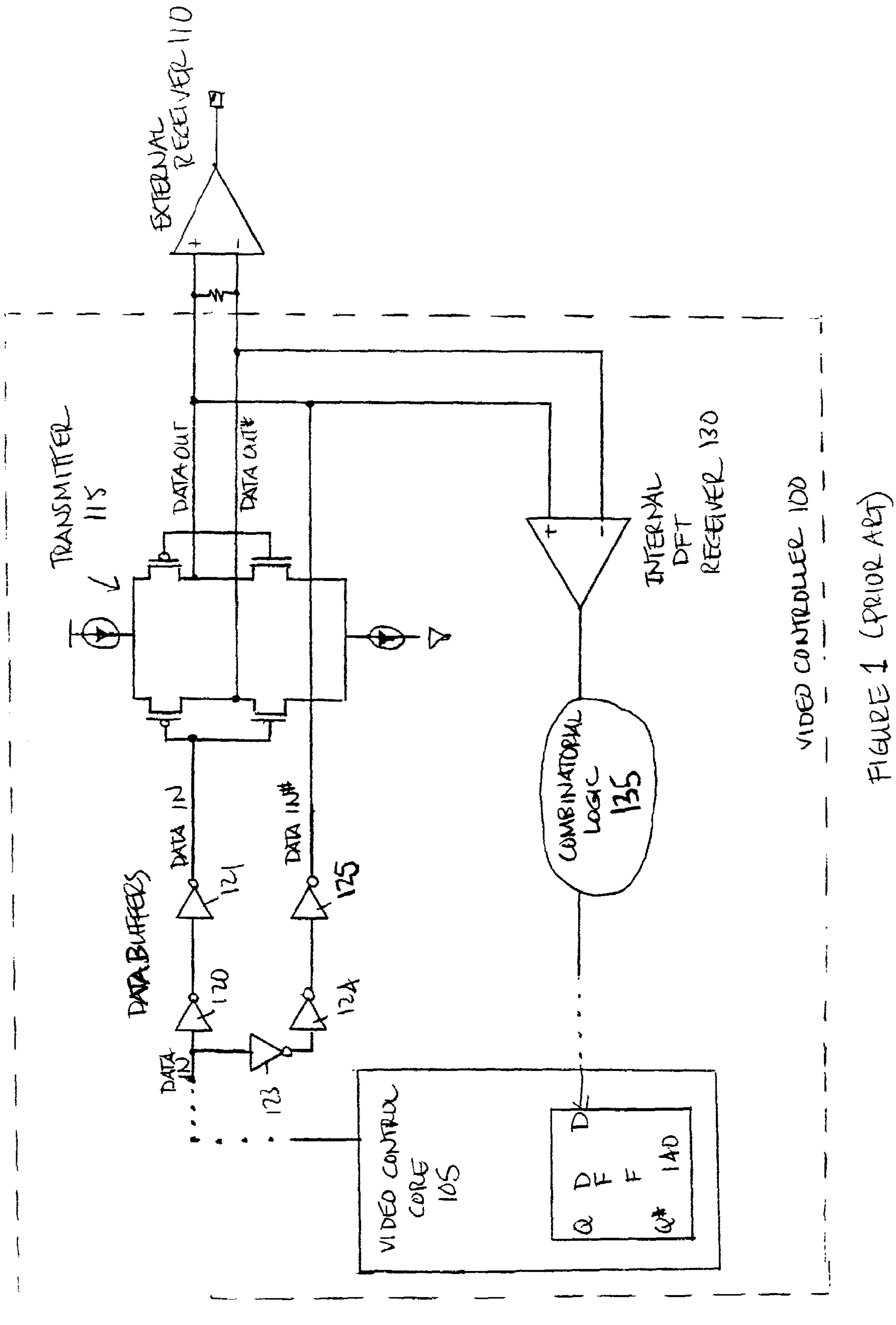
FIGURE 1 (PRIOR ART)
FIG. 1 is a diagram of a prior video controller including prior transmission and design for testability (DFT) circuits.
Figure 2:
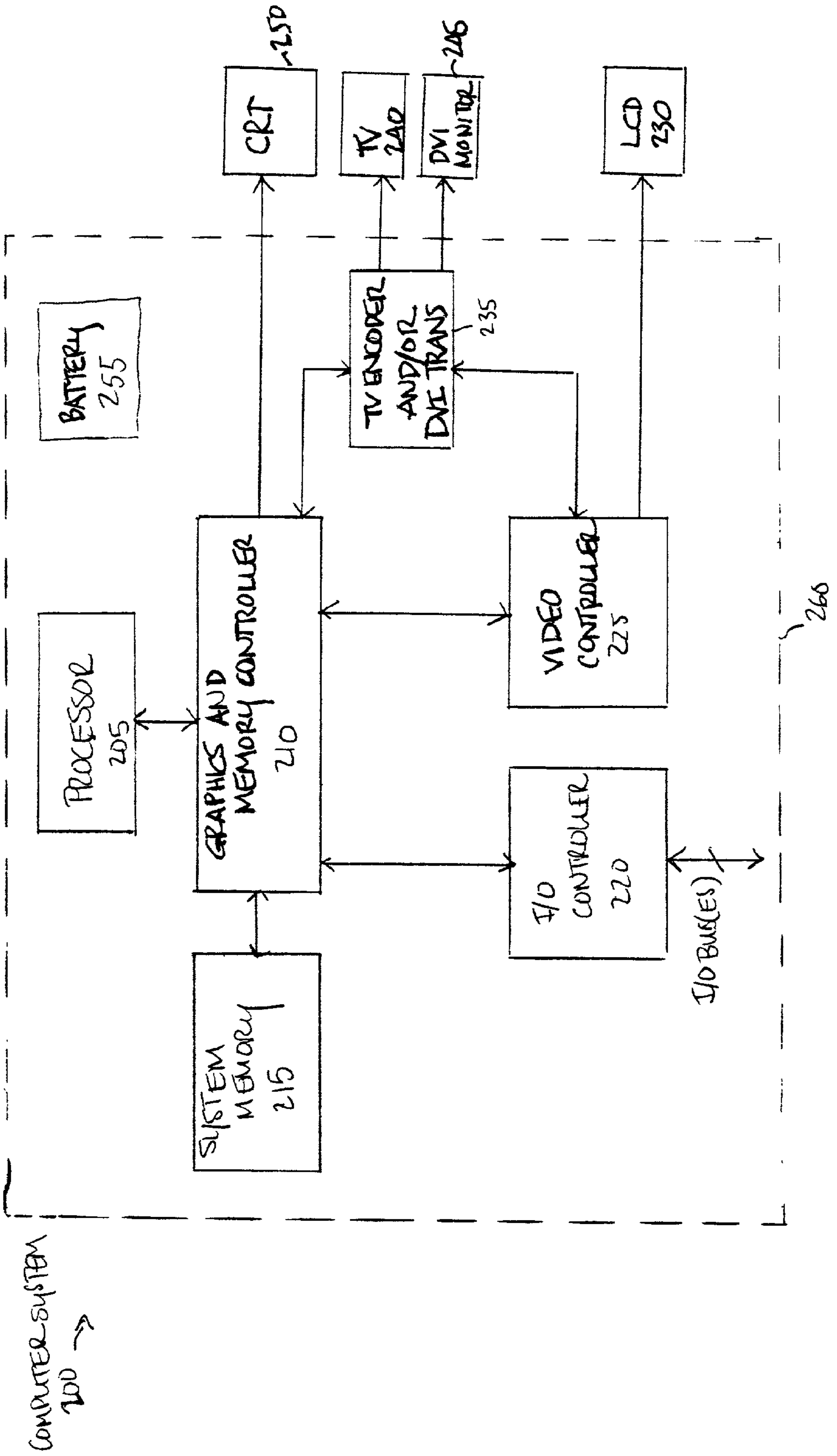
FIG. 2 is a block diagram of a computer in which the high frequency data transmission and/or design for testability (DFT) approaches of one embodiment may be advantageously used.

FIG. 2 is a block diagram of a computer system 200 that may advantageously include the video controller of various embodiments. The computer system 200 includes a processor 205 to execute instructions, a system memory 210 to store data and instructions for use by the processor 205 and a graphics and memory controller 215 to control graphics and memory-related transactions. An I/O controller 220 to control input/output transactions and a video controller 225 to control video transactions may be coupled to the graphics and memory controller 210. A display 230, such as, for example a liquid crystal flat panel display, may be coupled to an output of the video controller 225.

For other types of video data, such as television and/or digital visual interface (DVI) data, an encoder and/or translator 235 may be coupled to the video controller 225 and the graphics and memory controller 210. Corresponding displays 240 and/or 245 may be coupled to receive the output of the encoder and/or translator. Other types of displays such as a cathode ray tube (CRT) may also be included in the computer system 200.

For one embodiment, the computer system 200 is a mobile computer system such as a laptop that includes a battery 255 to provide an alternate power source for the computer system 200. For this embodiment, the elements within the dotted line 260 may be included on one or more printed circuit boards, for example.

For other embodiments, a different type of computer system configured in a different manner may advantageously use the high speed data transmission, design for testability and/or sense amplifier approaches of various embodiments. It will be appreciated that computer systems in accordance with the invention may include additional elements not shown in FIG. 2 and/or may not include all of the elements shown in FIG. 2.

Figure 3:
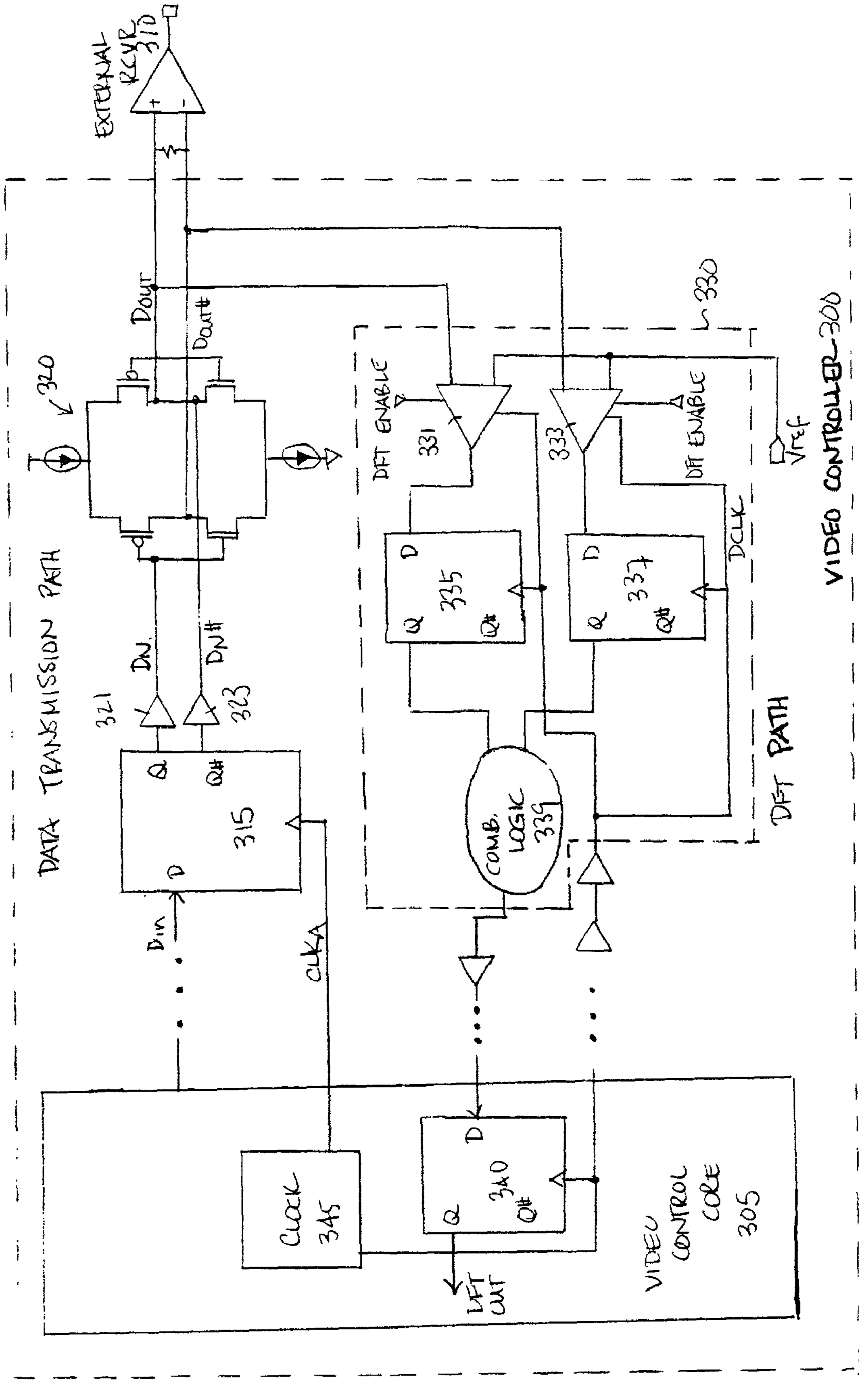
FIG. 3 is a schematic and block diagram of a video controller including the high frequency data transmission and DFT approaches of one embodiment that may be used in the computer of FIG. 2.

FIG. 3 is a block and schematic diagram of a video controller 300 that may be used, for example in the computer system 200 of FIG. 2. The video controller 300 includes a video control core 305 that includes control logic to provide control functions performed by the video controller 300. The video controller 300 also includes a data transmission path between the video control core and an output of the video controller 300 that may be coupled to an external receiver 310, which may be included, for example, in a flat panel or other type of display. The data transmission path includes a data latch 315 and a transmitter 320, wherein the data latch 315 is local to the transmitter 320.

The data latch 315 locally latches input data ($D_{in}$) received from the video control core 305 and provides both true ($D_N$) and complementary ($D_N$#) forms of the input data over symmetrical signal paths to inputs of the transmitter 320. Symmetrical signal paths, as the term is used herein, refers to the fact that the same type and number of devices (in this case, buffers 321 and 323) are included in the signal paths. Further the signal paths may be matched in other ways such as device orientation, sizing, etc., such that the true and complementary signal paths are substantially identical and provide substantially identical signal delay between the latch 315 and the transmitter 320.

The video controller 300 of one embodiment also includes a design for testability (DFT) data path including local DFT logic 330. The local DFT logic 330 is so called because it is located near the transmitter 320. For example, if the transmitter 320 is located near the periphery of the integrated circuit chip embodying the video controller 300, the DFT logic 330 is also located near the periphery of the chip and not in the center of the chip where the video control core may be.

The DFT logic 330 of one embodiment includes internal DFT receivers, local DFT latches 335 and 337, and combinatorial logic 339. For this embodiment, the first receiver 331 has one input coupled to receive a true form of an output signal ($D_{OUT}$) from the transmitter 320 while the second receiver 333 has one input coupled to receive a complementary form ($D_{OUT}$#) of the output signal from the transmitter 320. Each of the internal DFT receivers 331 and 333 has a second input coupled to receive a reference signal $V_{ref}$.

Figure 4:
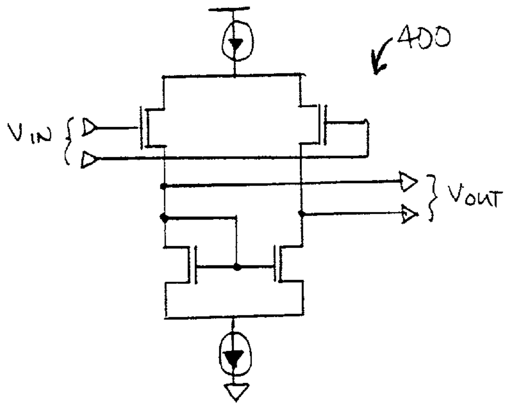
FIGURE 4 (PRIOR ART)
FIG. 4 is a schematic diagram of a prior analog comparator.

For some prior video controllers, an analog comparator such as the analog comparator 400 of FIG. 4 is used to implement an internal receiver used for DFT purposes. While the circuit 400 provides high DC gain, the signal delay through the circuit may be unacceptable at higher frequencies due to the analog nature of the design. Further, this type of comparator requires a highly accurate constant current mirror design and good matching layout techniques for proper operation such that the design process may be more complicated.

Figure 5:
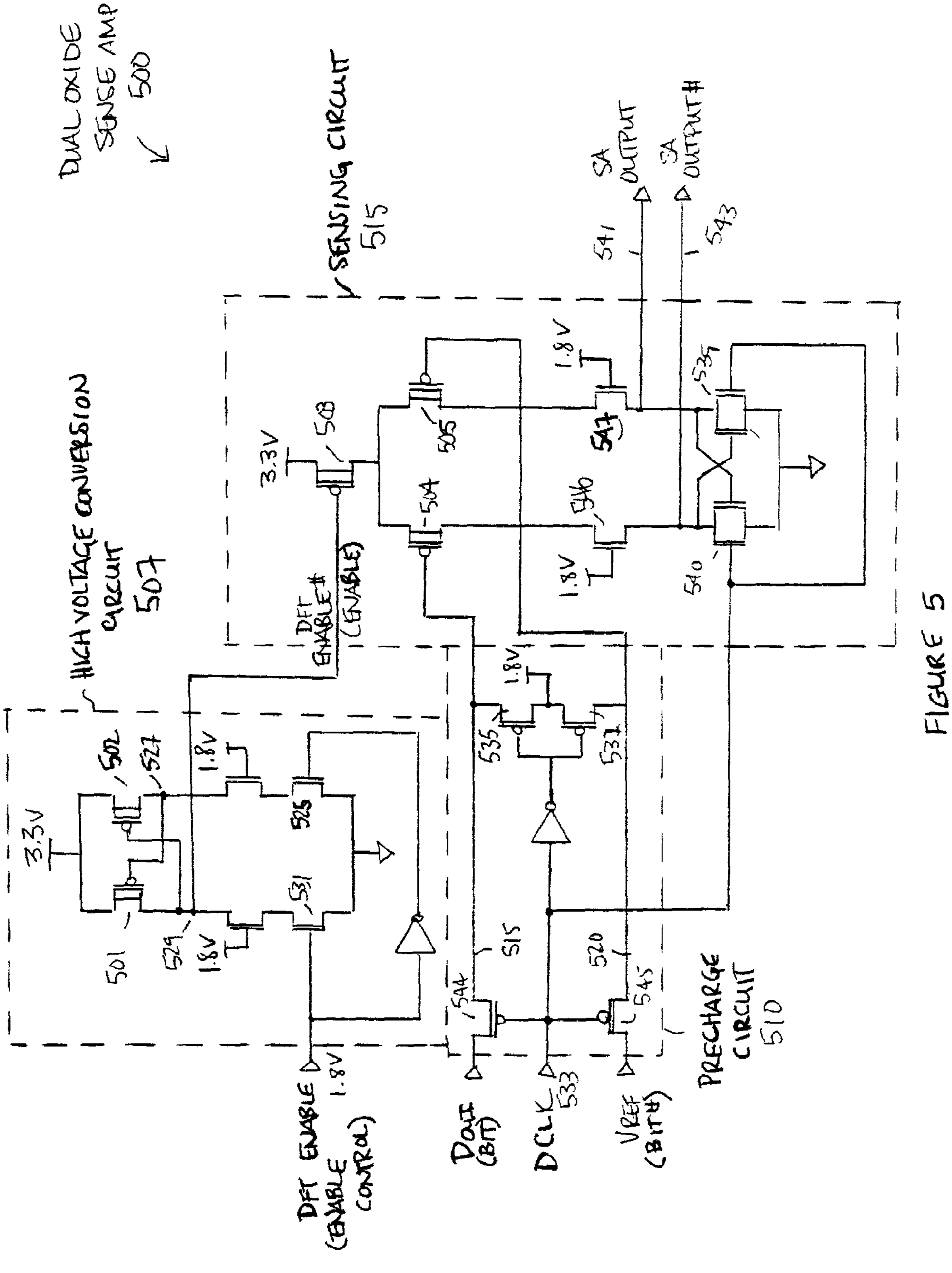
FIG. 5 is a schematic diagram of a dual oxide sense amplifier that may be used in the DFT path of the video controller of FIG. 3.

Thus, for one embodiment, the internal DFT receivers 331 and 333 of FIG. 3 may instead be implemented using a dual oxide sense amplifier (sense amp) such as the dual oxide sense amp 500 of FIG. 5. The dual oxide sense amp 500 is so called because it includes both thin and thick gate oxide devices. For example, for one embodiment, the devices 501–505 are thick oxide devices (as indicated by the illustration of a thicker gate in FIG. 5 for each of these devices) while the remaining devices have thinner gate oxides.

For purposes of illustration, it is assumed that the primary supply voltage for the integrated circuit chip including the dual oxide sense amplifier 500 is 1.8 volts. A higher supply voltage, such as 3.3 volts in this example, may also be used on the chip for some input/output signaling, for example. In this example, the thickness of the gate oxide for the devices having the thinner gate oxide is selected such that the gate oxide will not break down under operating conditions for a 1.8 volt supply environment. The thicker gate oxide devices such as the devices 501–505, however, have a gate oxide that is selected for a 3.3 volt supply environment. The manner in which gate oxide thicknesses are determined for particular supply voltage requirements is well-known to those of ordinary skill in the art.

With continuing reference to FIG. 5, the dual oxide sense amp 500 includes a high voltage conversion circuit 507 to convert an enable control signal (a DFT enable signal where the sense amp 500 is used in a DFT circuit) having a first signal swing to an enable signal (shown as DFT enable#) having a larger signal swing. For example, for one embodiment, the DFT enable signal may have a 1.8 volt signal swing (i.e. ground to 1.8 volts), while the DFT enable# signal may have a 3.3 volt signal swing (i.e. ground to 3.3 volts).

The dual oxide sense amp 500 also includes a dynamic precharging circuit 510 to precharge input bit lines 515 and 520 to a given voltage level (1.8 volts in the example shown in FIG. 5) prior to sensing.

A sensing circuit 525 is coupled to the high voltage conversion circuit 507 and the precharge circuit 510 to sense low voltage swing, differential input data received over the bit lines 515 and 520.

In operation, an enable control (also referred to herein as DFT enable) signal is received at an input to the high voltage conversion circuit 507. For this example, the DFT enable signal has a 1.8 volt signal swing (i.e. ground to 1.8 volts). For other embodiments, however, the voltage level of the DFT enable signal when it is asserted may be different.

When the DFT enable signal is low, a DFT control transistor 525 is enabled such that a node 527 is pulled toward ground. Pulling the node 527 toward ground causes the thick gate oxide transistor 501 to be enabled to pull up a node 529 toward 3.3 volts. Pulling the node 529 up to 3.3 volts turns off a thick gate oxide sense enable transistor 503 in the sensing circuit 515 that receives a 3.3 volt supply voltage. In this manner, when the DFT enable signal is deasserted, the sensing circuit 515 is disabled.

When the DFT enable signal is high, however, a second DFT control transistor 531 is enabled to pull the node 529 toward ground. As the node 529 is pulled toward ground, the thick gate oxide sense enable transistor 503 is turned on to enable the sensing circuit 515.

The dual oxide sense amp 500 also receives a clock signal (DCLK in this example) at a clock input 533. When the DCLK signal is high, precharge devices 535 and 537 are enabled to precharge input bit lines 515 and 520 to a predetermined voltage level (1.8 volts in this example) two inversions later. While the bit lines 515 and 520 are precharged high, sensing devices 504 and 505 and input transfer devices 544 and 545 are disabled. Also, when DCLK is high, pull down devices 539 and 540 are enabled to pull outputs 541 and 543 to ground.

When the DCLK signal transitions low, if the enable control signal is asserted such that the sensing circuit 515 is enabled, input transfer gates 544 and 545 are enabled and data on the bitlines 515 and 520 is transferred to the gates of the thick gate oxide sensing devices 504 and 505. Pull down devices 539 and 540 are disabled as the DCLK signal transitions low. Outputs 541 and 543 are then responsive to the data on the bitlines 515 and 520.

For one embodiment, data received over the bitlines 515 and 520 is in the form of a low voltage swing signal. For example, where the supply voltages are as shown in FIG. 5, the input signal swing may be between 1.0 volts and 1.4 volts. Other signal swing ranges are within the scope of various embodiments. Because the bitlines 515 and 520 have been precharged to 1.8 volts in the exemplary embodiment of FIG. 5, where the input signal swing is 1.4 to 1.0 volts, the bitlines 515 and 520 only have to swing down 400–800 mV in response to the input signal(s).

When the sensing circuit 515 is enabled, one terminal of each of the sensing gates 504 and 505 is at 3.3 volts such that when either of the gates 504 or 505 is enabled in response to input data, a 3.3 volt output signal would be provided at a corresponding output if it were not for level shifting transistors 546 and 547. For one embodiment, each of the level shifting transistors 546 and 547 has its gate tied to the lower supply voltage (1.8 volts in this example) such that the 3.3 volt swing of the outputs, if they were instead coupled above the level shifting transistors 546 and 547, is shifted down to a 1.8 volt swing minus the Vth drop of the level shifting transistors 546 and 547.

Using thick gate oxide sensing devices that receive a higher supply voltage (3.3 volts in the example of FIG. 5) provides advantages as compared to a comparator circuit that only uses thin gate oxide devices. As a specific example, where the Vcc is 1.8 volts +/−10%, the worst case Vcc could be close to 1.6 volts. Where the LVDS signal swing is 1.0–1.4 volts as in the above example, it may be impractical to sense the LVDS signal, particularly for worst case Vcc conditions. Use of the thick gate oxide sensing devices 504 and 505 that receive a 3.3 volt supply voltage enables high speed operation of the sense amp 500 even at worst case voltage supply, temperature and process conditions by improving dynamic input range.

Further, by precharging the bitlines of the sense amp 500, differential noise is reduced and better noise immunity is provided as compared to prior analog comparators. This is because any noise or offset on the inputs is equalized during precharging of the bitlines prior to any sensing.

Although the operation of the sense amp circuit 500 is described in connection with DFT logic in a video controller, it will be appreciated that the sense amp circuit of various embodiments may be advantageously used for other applications.

Referring back to FIG. 3, each of the internal DFT receivers 331 and 333 has an output coupled to a corresponding one of the local DFT latches 335 and 337, respectively. Outputs of the local DFT latches 335 and 337 are coupled to combinatorial logic 339. One or more outputs of the combinatorial logic 339 are coupled to one or more remote DFT latches 340 that may be located in the video control core 305.

For the embodiment shown in FIG. 3, each of the data latch 315, the remote DFT latch 340, the local DFT latches 335 and 337 and the internal DFT receivers 331 and 333 is coupled to receive a clock signal from a clock source such as the internal clock generator 345, which may be located, for example, in the video control core 305.

Also, for one embodiment, each of the latches 340, 315, 335 and 337 is a D-type flip-flop. For other embodiments, however, a different type of latching circuit may be used.

Figure 6:
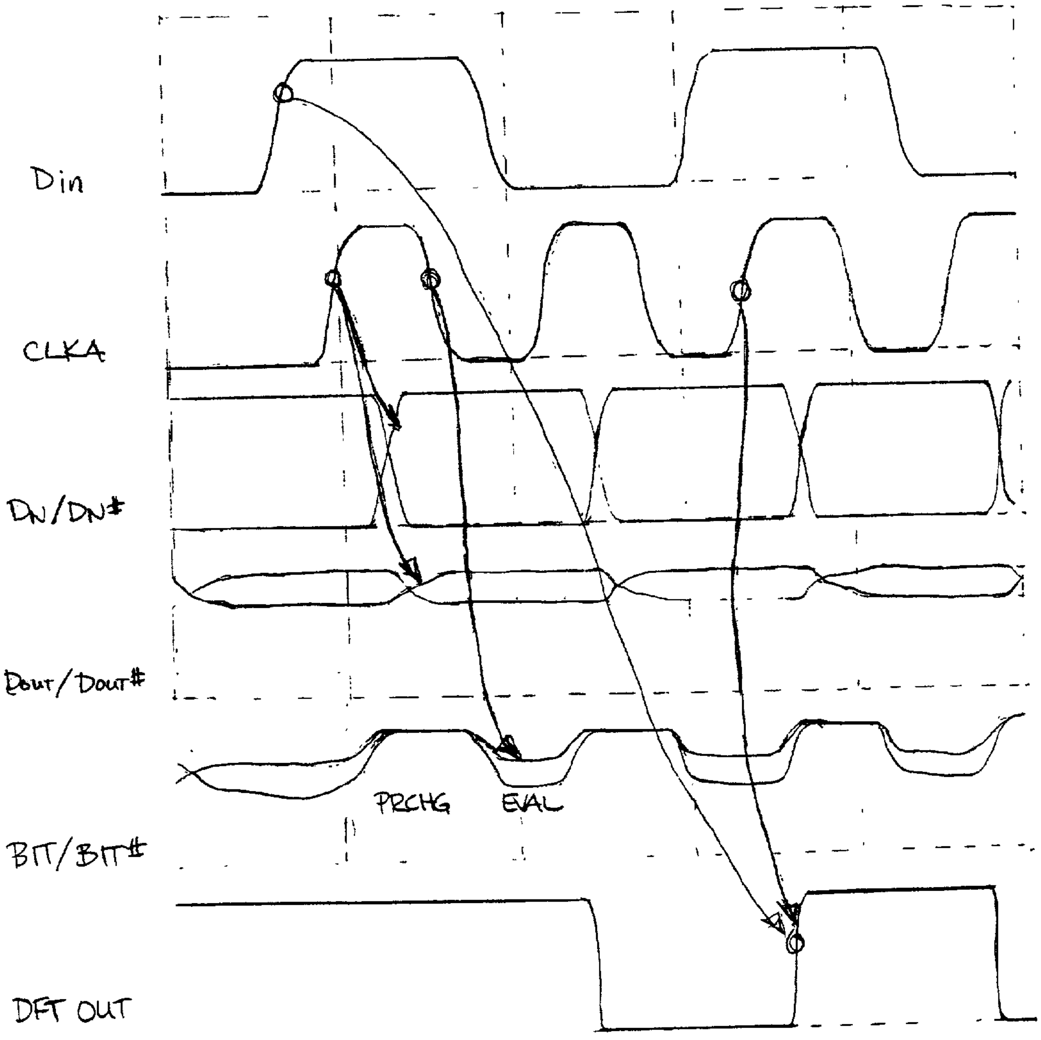
FIG. 6 is a timing diagram showing the operation of the transmission and DFT paths of FIG. 3.

Referring to FIGS. 3, 5 and 6, the operation of the data transmission path and DFT path circuitry of the video controller 300 is described in more detail. In response to a rising edge of clock signal CLKA, data $D_{in}$ at the input of latch 315 is provided at latch 315 Q and Q# outputs and through buffers 321 and 323 as true and complementary data $D_N$ and $D_N$#, respectively. In response to receiving $D_N$ and $D_N$#, the transmitter 320 provides low voltage swing differential output signals $D_{OUT}$ and $D_{OUT}$#. $D_{OUT}$ and $D_{OUT}$# may be provided, for example, to an external receiver 310 in a flat panel or other type of display.

Concurrently, $D_{OUT}$ and $D_{OUT}$# may also be received by DFT logic 330 at internal DFT receivers 331 and 333, respectively. A DFT enable signal from, for example, the video control core 305 may be used to enable operation of DFT logic 330. Where DFT features are enabled (for internal testing purposes, for example), each of the internal DFT receivers 331 and 333 is responsive to a delayed and buffered clock signal DCLK. The delay of the DCLK signal as compared to the CLKA signal is determined to ensure that the correct data is available and stable at the inputs of the internal DFT receivers 331 and 333 before the receivers 331 and 333 are enabled.

When the DCLK signal transitions from high to low, the input transfer gates of the internal DFT receivers 331 and 333 are enabled to sample the respective data input, $D_{OUT}$ or $D_{OUT}$#. The receivers 331 and 333 then compare the input data to a reference voltage signal Vref in the manner described above in reference to FIG. 5. The reference signal Vref of one embodiment is an external reference voltage used to compare with the output of the transmitter 320 to determine whether the transmitter output is reaching a sufficient level for a logic 1 or 0.

Each of the internal DFT receivers 331 and 333 then provides a responsive amplified output signal at an input of a corresponding one of the local DFT latches 335 or 337. This input data is then latched by the local DFT latches 335 and 337 on the next rising edge of the DCLK signal.

During the next DCLK cycle, data at the outputs of the latches 335 and 337 is provided to combinatorial logic 339 that identifies the data as either a logic 1 or 0. The output of combinatorial logic 339 is then provided to a latch 340 in the video control core 305 where it is latched on the next rising edge of the DCLK signal. For this example then, in the third clock cycle of CLKA, output data DFT OUT is available at an output of the core flip-flop 340. The output of the flip-flop 340 may then be compared with an expected signal to determine whether the transmitter 320 is operating properly.

Using the above-described approach, the delay of the combinatorial logic 339 and transmission of the output of the combinatorial logic 339 over long interconnects is moved into a subsequent clock cycle to eliminate the speed path presented by some prior designs. In this manner, the data transmission and DFT topologies of various embodiments can be used for very high frequency operating environments.

Further, the ability to use low voltage swing signals helps to reduce electromagnetic induction (EMI) and provides better noise immunity as compared to full swing complementary metal oxide semiconductor (CMOS) logic, particularly for high speed applications.

By using low voltage swing signals, clocking the internal DFT receivers and precharging the bitlines of the internal receivers in the manner described above, it may be possible to use smaller transistors as compared to prior circuits that, for example, rely on biasing transistors to achieve higher speed operation. In this manner, power dissipation may also be reduced.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:

core control logic to provide a data signal;

output drive logic including a local data latch and a transmitter, the data latch to receive the data signal and to provide true and complementary forms of the data signal to the transmitter over symmetrical signal paths, the transmitter to provide an output signal to an external receiver; and design for testability (DFT) logic local to the transmitter, the DFT logic including an internal receiver coupled to an output of the transmitter and a local DFT latch coupled to an output of the internal receiver.

2. The apparatus of claim 1 wherein the internal receiver comprises a dual oxide sense amplifier.

3. The apparatus of claim 2 wherein the dual oxide sense amplifier includes precharge logic to precharge input lines to the dual oxide sense amplifier to a first voltage level.

4. The apparatus of claim 3 wherein the dual oxide sense amplifier is clocked.

5. The apparatus of claim 3 wherein the dual oxide sense amplifier is capable of operating in response to low voltage swing, differential input signals.

6. The apparatus of claim 1 wherein the core control logic is video control logic.

7. The apparatus of claim 1 wherein the internal receiver is to compare an output of the transmitter with a reference voltage and the local DFT latch is to latch a result of the comparison.

8. An apparatus comprising:

core control logic to provide a data signal;

a data transmission output driver including a local data latch and a transmitter, the data latch to latch data from the core control logic destined for the transmitter, the transmitter to be coupled to an external receiver; and design for testability (DFT) logic including an internal receiver and a local DFT latch, the internal receiver to compare an output of the transmitter with a reference voltage, the local DFT latch to latch a result of the comparison.

9. The apparatus of claim 8 further comprising true and complementary signal paths between the data latch and the transmitter, the true and complementary signal paths being substantially symmetrical.

10. The apparatus of claim 8 wherein the core control logic is video core control logic.

11. The apparatus of claim 8 wherein the internal receiver comprises two dual oxide sense amplifiers, a first dual oxide sense amplifier to receive a true form of the transmitter output, a second dual oxide sense amplifier to receive a complementary form of the transmitter output.

12. The apparatus of claim 11 wherein the signal lines of the dual oxide sense amplifiers are to be precharged prior to sensing.

13. The apparatus of claim 11 wherein the dual oxide sense amplifiers are to receive two different, non-ground supply voltages.

14. The apparatus of claim 11 wherein at least one of the dual oxide sense amplifiers includes a sensing circuit having differential input bit lines, the sensing circuit to sense a low voltage swing signal in response to an enable signal;

a precharge circuit to precharge the input bit lines; and a high voltage conversion circuit to receive an input signal having a first voltage swing and to provide the enable signal having a larger voltage swing, the at least one dual oxide sense amplifier including at least a first transistor having a gate oxide of a first thickness and a second transistor having a gate oxide of a second thickness greater than the first thickness.

15. A method comprising:

receiving video data from core control logic at a latch;

transmitting true and complementary forms of the video data from the latch to a local transmitter over symmetrical signal paths;

providing output data from the transmitter to an external receiver; and receiving the output data from the transmitter at an internal receiver;

comparing the output data to a reference signal;

locally latching an output of the internal receiver;

amplifying the output of the internal receiver; and providing the amplified output of the internal receiver to the core control logic.

* * * * *